United States Patent
Ryu et al.

(10) Patent No.: US 12,069,928 B2
(45) Date of Patent: Aug. 20, 2024

(54) DISPLAY DEVICE

(71) Applicant: Samsung Display Co., Ltd., Yongin-si (KR)

(72) Inventors: Yunha Ryu, Yongin-si (KR); Hyojoon Kim, Yongin-si (KR); Kisoo Park, Yongin-si (KR); Junghyun Kwon, Yongin-si (KR); Seontae Yoon, Yongin-si (KR); Hyeseung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 389 days.

(21) Appl. No.: 17/584,288

(22) Filed: Jan. 25, 2022

(65) Prior Publication Data

US 2022/0293684 A1 Sep. 15, 2022

(30) Foreign Application Priority Data

Mar. 9, 2021 (KR) .................. 10-2021-0030939

(51) Int. Cl.
*H10K 59/38* (2023.01)
*H10K 50/86* (2023.01)
*H10K 59/12* (2023.01)

(52) U.S. Cl.
CPC .......... *H10K 59/38* (2023.02); *H10K 50/865* (2023.02); *H10K 59/12* (2023.02)

(58) Field of Classification Search
CPC ...... H10K 59/38; H10K 50/865; H10K 59/12; H10K 71/00; H10K 59/123; H10K 59/124; H10K 50/8428; H10K 50/8445; H01L 27/156; G02B 5/201
See application file for complete search history.

(56) References Cited

U.S. PATENT DOCUMENTS

| | | | |
|---|---|---|---|
| 8,933,623 B2 | 1/2015 | Hanamura et al. | |
| 10,923,538 B2 | 2/2021 | Lee et al. | |
| 2020/0091247 A1 | 3/2020 | Lee et al. | |
| 2020/0152704 A1* | 5/2020 | Jang ................... | H10K 59/1201 |
| 2021/0249478 A1 | 8/2021 | Oh et al. | |

FOREIGN PATENT DOCUMENTS

| | | |
|---|---|---|
| CN | 113257855 A | 8/2021 |
| KR | 10-2020-0031748 A | 3/2020 |
| KR | 10-2020-0121430 A | 10/2020 |

* cited by examiner

*Primary Examiner* — Mohammad A Rahman
(74) *Attorney, Agent, or Firm* — Lewis Roca Rothgerber Christie LLP

(57) ABSTRACT

A display device includes first and second light-emitting diodes in respective first and second emission areas, an encapsulation layer thereon, and including at least one inorganic encapsulation layer and at least one organic encapsulation layer, a color conversion-transmission layer on the encapsulation layer, and including a color conversion part to convert light emitted from the first or second light-emitting diodes into a different color, and a light blocking partition wall surrounding the color conversion part, first and second color filters on the color conversion-transmission layer, and respectively corresponding to the first and second emission areas, wherein respective first end portions of the first and second color filters are spaced from each other while overlapping the light blocking partition wall, and are partly covered with a third color material having a color that is different from the first and second color filters.

20 Claims, 14 Drawing Sheets

DISPLAY DEVICE

CROSS-REFERENCE TO RELATED APPLICATION

This application claims priority to, and the benefit of, Korean Patent Application No. 10-2021-0030939, filed on Mar. 9, 2021, in the Korean Intellectual Property Office, the disclosure of which is incorporated by reference herein in its entirety.

BACKGROUND

1. Field

One or more embodiments relate to a display device.

2. Description of the Related Art

As the field of displays for visually expressing a variety of electric signal information is rapidly developing, various display devices having excellent characteristics, such as slimness, reduced weight, and low power consumption, have been introduced.

Display devices may include a liquid crystal display device using a backlight, instead of being self-emissive, or a light-emitting display device including display elements capable of emitting light. A light-emitting display device may include display elements each including an emission layer.

SUMMARY

One or more embodiments include a display device, and a structure for a light-emitting display device.

Additional aspects will be set forth in part in the description which follows and, in part, will be apparent from the description, or may be learned by practice of the presented embodiments of the disclosure.

According to one or more embodiments, a display device includes a substrate, a first light-emitting diode on the substrate in a first emission area, a second light-emitting diode on the substrate in a second emission area, an encapsulation layer on the first light-emitting diode and the second light-emitting diode, and including at least one inorganic encapsulation layer and at least one organic encapsulation layer, a color conversion-transmission layer on the encapsulation layer, and including a color conversion part configured to convert light emitted from one of the first light-emitting diode and the second light-emitting diode into light of a different color, and a light blocking partition wall surrounding the color conversion part, a first color filter on the color conversion-transmission layer, and corresponding to the first emission area, and a second color filter on the color conversion-transmission layer, and corresponding to the second emission area, wherein a first end portion of the first color filter and a first end portion of the second color filter are spaced apart from each other with a gap therebetween while overlapping the light blocking partition wall, and are at least partly covered with a third color material having a color that is different from the first color filter and the second color filter.

A portion of the third color material may at least partially fill the gap.

The third color material may be in direct contact with a side surface of the first end portion of the first color filter and with a side surface of the first end portion of the second color filter.

The display device may further include an insulating layer on the color conversion-transmission layer, wherein a lower surface of the first color filter, a lower surface of the second color filter, and a lower surface of the third color material are in direct contact with the insulating layer.

A reflectance of the third color material may be less than a reflectance of a first color material of the first color filter and less than a reflectance of a second color material of the second color filter in a wavelength band of about 380 nm to about 780 nm.

A refractive index of the third color material may be less than a refractive index of the first color filter and less than a refractive index of the second color filter.

A height of the third color material may be less than about 0.19 times a width of the third color material.

A height of the third color material may be greater than a height of a central portion of the first color filter and greater than a height of a central portion of the second color filter.

The display device may further include an overcoat layer on the first color filter and the second color filter, wherein a lower surface of the overcoat layer includes a concave surface corresponding to a convex upper surface of the third color material.

According to one or more embodiments, a display device includes a first light-emitting diode in a first emission area, a second light-emitting diode in a second emission area, an encapsulation layer on the first light-emitting diode and the second light-emitting diode, and including at least one inorganic encapsulation layer and at least one organic encapsulation layer, a first color filter on the encapsulation layer, corresponding to the first emission area, and having a first color, and a second color filter on the encapsulation layer, corresponding to the second emission area, and having a second color, wherein a first end portion of the first color filter and a first end portion of the second color filter are spaced apart from each other with a gap therebetween, and are at least partly covered with a third color material having a third color.

A portion of the third color material may at least partially fill the gap.

The third color material may be in direct contact with a side surface of the first end portion of the first color filter and with a side surface of the first end portion of the second color filter.

The display device may further include an insulating layer below the first color filter and the second color filter, wherein a lower surface of the first color filter, a lower surface of the second color filter, and a lower surface of the third color material are each in direct contact with the insulating layer.

A reflectance of the third color material may be less than a reflectance of a first color material of the first color filter and less than a reflectance of a second color material of the second color filter in a wavelength band of about 380 nm to about 780 nm.

A refractive index of the third color material may be less than a refractive index of the first color filter and less than a refractive index of the second color filter.

A height of the third color material may be less than about 0.19 times a width of the third color material.

A height of the third color material may be greater than a height of a central portion of the first color filter and greater than a height of a central portion of the second color filter.

The display device may further include a color conversion-transmission layer between the encapsulation layer and the first and second color filters, and including a first color conversion part configured to convert light emitted from one of the first light-emitting diode and the second light-emitting diode into light of a different color, and a light blocking partition wall surrounding the first color conversion part.

The first end portion of the first color filter and the first end portion of the second color filter may overlap the light blocking partition wall.

The gap between the first end portion of the first color filter and the first end portion of the second color filter may overlap the light blocking partition wall.

Other aspects, features, and advantages of the disclosure will become better understood through the accompanying drawings, the claims, and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
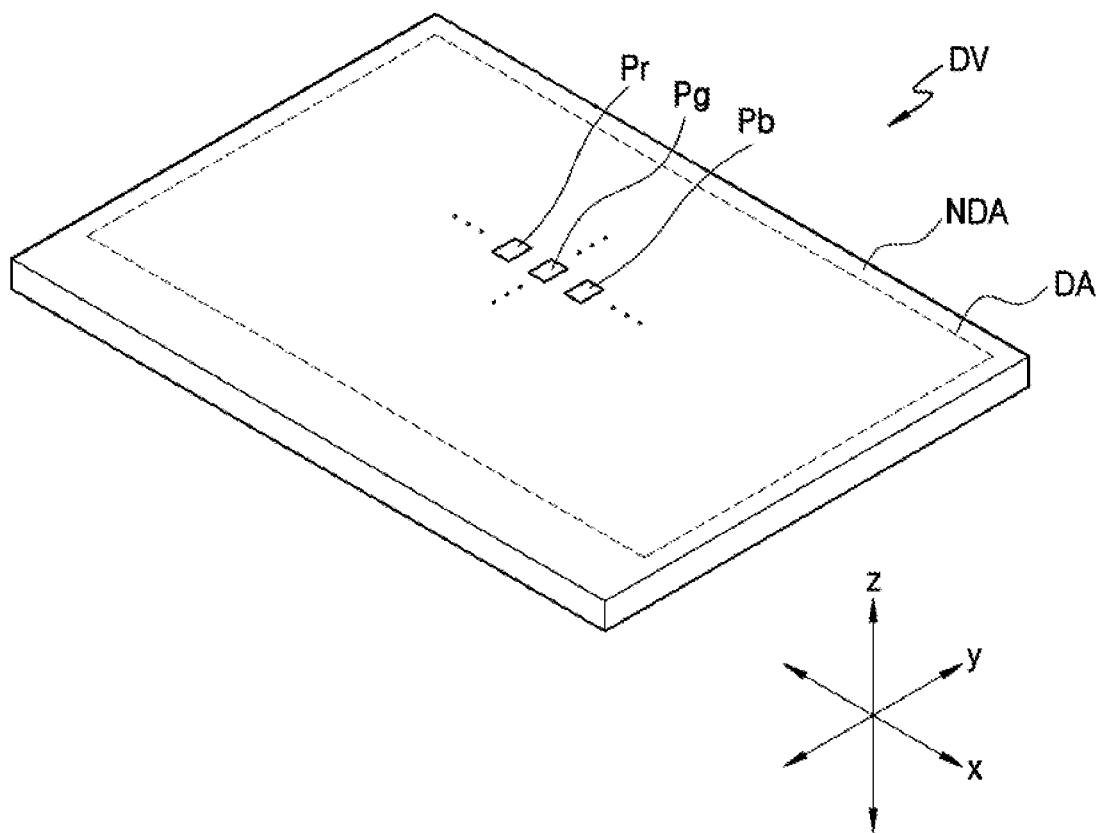
FIG. 1 is a schematic perspective view of a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display device DV according to some embodiments.

Referring to FIG. 1, the display device DV may include a display area DA, and a non-display area NDA outside the display area DA. The display device DV may provide an image through an array of a plurality of pixels that are two-dimensionally arranged on an x-y plane in the display area DA. The pixels include a first pixel, a second pixel, and a third pixel. For convenience of explanation, a case in which the first pixel is a red pixel Pr, the second pixel is a green pixel Pg, and the third pixel is a blue pixel Pb will be described.

The red pixel Pr, the green pixel Pg, and the blue pixel Pb are areas that allow red light, green light, and blue light to be emitted, respectively. The display device DV may provide an image by using light emitted from the pixels.

The non-display area NDA is an area that does not provide an image, and may completely surround the display area DA. Drivers or main power lines configured to provide an electric signal or power to pixel circuits may be arranged in the non-display area NDA. A pad, which is an area to which electronic elements or printed circuit boards may be electrically connected, may be included in the non-display area NDA.

As illustrated in FIG. 1, the display area DA may have a polygonal shape including a quadrangle. For example, the display area DA may have a rectangular shape in which a horizontal length is greater than a vertical length, may have a rectangular shape in which a horizontal length is less than a vertical length, or may have a square shape. Alternatively, the display area DA may have various shapes, such as an elliptical shape or a circular shape.

Figure 2:
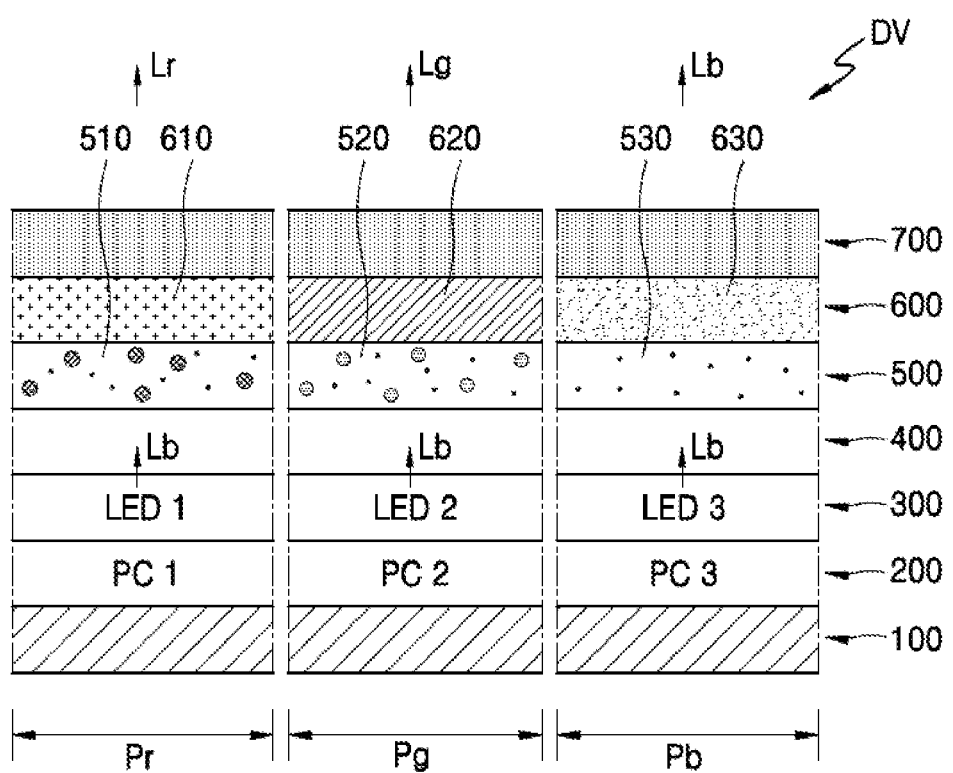
FIG. 2 is a schematic cross-sectional view of pixels of the display device, according to some embodiments.

FIG. 2 is a schematic cross-sectional view of pixels of the display device DV, according to some embodiments.

Referring to FIG. 2, the display device DV may include a circuit layer 200 on a substrate 100. The circuit layer 200 may include first to third pixel circuits PC1, PC2, and PC3. The first to third pixel circuits PC1, PC2, and PC3 may be electrically connected to first to third light-emitting diodes LED1, LED2, and LED3 of a light-emitting diode layer 300, respectively.

Each of the first to third light-emitting diodes LED1, LED2, and LED3 may include an organic light-emitting diode including an organic material. In other embodiments, each of the first to third light-emitting diodes LED1, LED2, and LED3 may include an inorganic light-emitting diode including an inorganic material. The inorganic light-emitting diode may include a PN junction diode including inorganic semiconductor-based materials. When a voltage is applied to the PN junction diode in a forward direction, holes and electrons may be injected and recombined to generate energy. The PN junction diode may convert the generated energy into light energy to emit light of a given color. The inorganic light-emitting diode may have a width of about several micrometers to about several hundred micrometers, or of about several nanometers to about several hundred nanometers. In some embodiments, the light-emitting diode LED may be a light-emitting diode including quantum dots. As described above, an emission layer of the light-emitting diode LED may include an organic material, an inorganic material, quantum dots, an organic material and quantum dots, or an inorganic material and quantum dots.

The first to third light-emitting diodes LED1, LED2, and LED3 may emit light of the same color. For example, light (e.g., blue light Lb) emitted from the first to third light-emitting diodes LED1, LED2, and LED3 may pass through a color conversion-transmission layer 500 via an encapsulation layer 400 on the light-emitting diode layer 300.

The color conversion-transmission layer 500 may include optical parts that convert light of a given color (e.g., blue light Lb) emitted from the light-emitting diode layer 300, or may transmit the light of a given color (e.g., blue light Lb) emitted from the light-emitting diode layer 300 without color conversion. For example, the color conversion-transmission layer 500 may include color conversion parts that convert light (e.g., blue light Lb) emitted from the light-emitting diode layer 300 into different color light, and a transmission part that transmits light (e.g., blue light Lb) emitted from the light-emitting diode layer 300 without color conversion. For example, the color conversion-transmission layer 500 may include a first color conversion part 510 corresponding to the red pixel Pr, a second color conversion part 520 corresponding to the green pixel Pg, and a transmission part 530 corresponding to the blue pixel Pb. The first color conversion part 510 may convert the blue light Lb into the red light Lr, and the second color conversion part 520 may convert the blue light Lb into the green light Lg. The transmission part 530 may transmit the blue light Lb without converting the blue light Lb.

The color layer 600 may be on the color conversion-transmission layer 500. The color layer 600 may include first to third color filters 610, 620, and 630 for different respective colors. For example, the first color filter 610 may be a red color filter, the second color filter 620 may be a green color filter, and the third color filter 630 may be a blue color filter.

The color-converted light and the transmitted light from the color conversion-transmission layer 500 may pass respectively through the first to third color filters 610, 620, and 630, so that color purity may be improved. Also, the color layer 600 may reduce, prevent, or minimize external light (for example, light incident from the outside of the display device DV to the display device DV) from being reflected and visually recognized by a user.

An overcoat layer 700 for flattening the upper surface of the color layer 600 may be included on the color layer 600. The overcoat layer 700 may include a transmissive organic material. For example, the overcoat layer 700 may include a transmissive organic material such as an acrylic resin. The overcoat layer 700 may be directly applied and cured on the color layer 600, and may be farther from the light-emitting diode layer 300 than the color layer 600 in the thickness direction (z direction) of the display device DV.

In some embodiments, another optical film, such as an anti-reflection (AR) film, may be on the overcoat layer 700.

The display device DV having the above-described structure may include a mobile phone, a television, an advertisement board, a monitor, a tablet personal computer (PC), a laptop computer, and the like.

Figure 3:
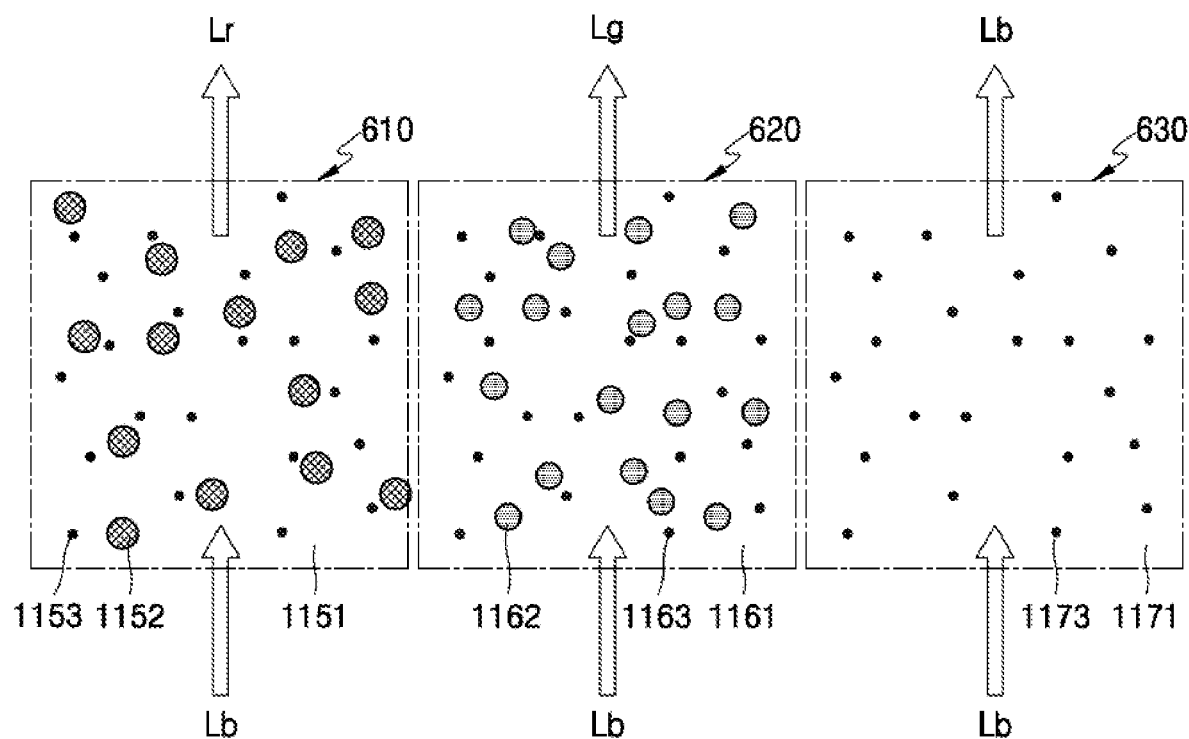
FIG. 3 illustrates optical parts of a color conversion-transmission layer of FIG. 2.

FIG. 3 illustrates optical parts of the color conversion-transmission layer of FIG. 2.

Referring to FIG. 3, the first color conversion part 510 may convert incident blue light Lb into red light Lr. As illustrated in FIG. 3, the first color conversion part 510 may include a first photosensitive polymer 1151, and first quantum dots 1152 and first scattering particles 1153 dispersed in the first photosensitive polymer 1151.

The first quantum dots 1152 may be excited by the blue light Lb to isotropically emit the red light Lr having a wavelength that is longer than that of the blue light Lb. The first photosensitive polymer 1151 may include an organic material having light transmittance. The first scattering particles 1153 may scatter the blue light Lb that has not been absorbed by the first quantum dots 1152, so that more first quantum dots 1152 are excited, thereby increasing color conversion efficiency. The first scattering particles 1153 may include, for example, titanium oxide ($TiO_2$) or metal particles. The first quantum dots 1152 may include Group II-VI compounds, Group III-V compounds, Group IV-VI compounds, Group IV elements, Group IV compounds, or any combination thereof.

The second color conversion part 520 may convert incident blue light Lb into green light Lg. As illustrated in FIG. 3, the second color conversion part 520 may include a second photosensitive polymer 1161, and second quantum dots 1162 and second scattering particles 1163 dispersed in the second photosensitive polymer 1161.

The second quantum dots 1162 may be excited by the blue light Lb to isotropically emit the green light Lg having a wavelength that is longer than that of the blue light Lb. The second photosensitive polymer 1161 may include an organic material having light transmittance.

The second scattering particles 1163 may scatter the blue light Lb that has not been absorbed by the second quantum dots 1162, so that a greater number of second quantum dots 1162 are excited, thereby increasing color conversion efficiency. The second scattering particles 1163 may include, for example, titanium oxide ($TiO_2$) or metal particles. The second quantum dots 1162 may include Group II-VI compounds, Group III-V compounds, Group IV-VI compounds, Group IV elements, Group IV compounds, or any combination thereof.

In some embodiments, the first quantum dots 1152 and the second quantum dots 1162 may be the same material. In this case, the sizes of the first quantum dots 1152 may be greater than the sizes of the second quantum dots 1162.

The transmission part 530 may transmit the blue light Lb incident thereon without conversion. As illustrated in FIG. 3, the transmission part 530 may include a third photosensitive polymer 1171 in which third scattering particles 1173 are dispersed. The third photosensitive polymer 1171 may include, for example, an organic material having light transmittance, such as a silicone resin or an epoxy resin, and may include the same material as that of the first and second photosensitive polymers 1151 and 1161. The third scattering particles 1173 may scatter and emit the incident blue light Lb, and may include the same material as that of the first and second scattering particles 1153 and 1163.

Figure 4:
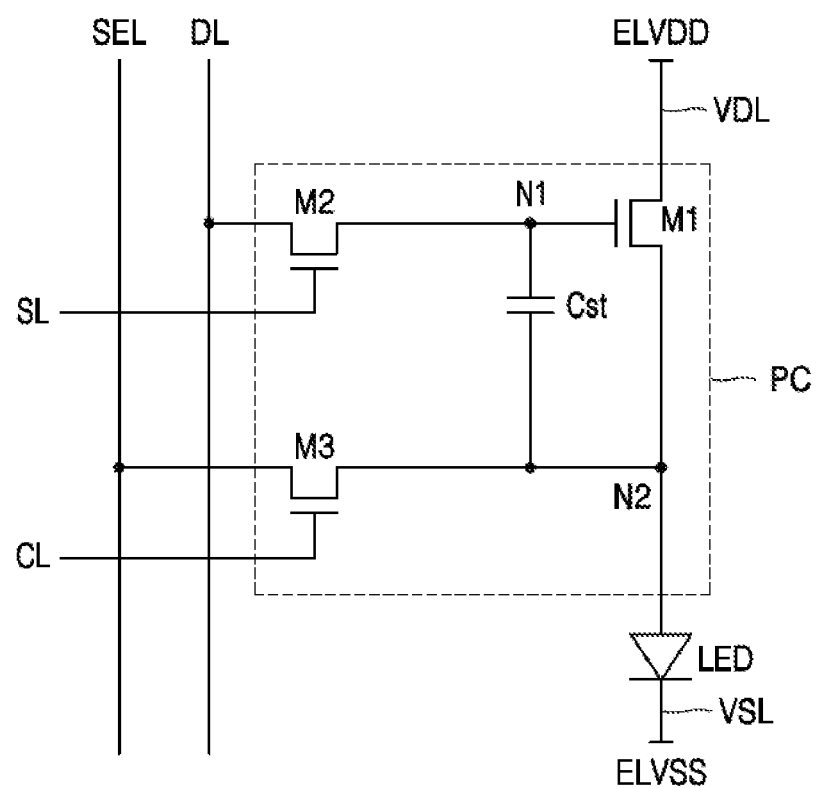
FIG. 4 is an equivalent circuit diagram of a light-emitting diode and a pixel circuit electrically connected to the light-emitting diode in the display device, according to some embodiments.

FIG. 4 is an equivalent circuit diagram of a light-emitting diode, and a pixel circuit electrically connected to the light-emitting diode in the display device, according to some embodiments.

Referring to FIG. 4, a first electrode (e.g., an anode) of a light-emitting diode LED may be connected to a pixel circuit PC, and a second electrode (e.g., a cathode) of the light-emitting diode LED may be connected to a common voltage line VSL configured to provide a common power voltage ELVSS. The light-emitting diode LED may emit light with a luminance corresponding to an amount of electric current supplied from the pixel circuit PC.

The light-emitting diode LED of FIG. 4 may correspond to each of the first to third light-emitting diodes LED1, LED2, and LED3 illustrated in FIG. 2, and the pixel circuit PC of FIG. 4 may correspond to each of the first to third pixel circuits PC1, PC2, and PC3 illustrated in FIG. 2.

The pixel circuit PC may control the amount of electric current flowing from a driving power supply voltage ELVDD to a common power supply voltage ELVSS via the light-emitting diode LED in response to a data signal. The pixel circuit PC may include a driving transistor M1, a switching transistor M2, a sensing transistor M3, and a storage capacitor Cst.

Each of the driving transistor M1, the switching transistor M2, and the sensing transistor M3 may be an oxide semiconductor thin-film transistor with a semiconductor layer including an oxide semiconductor, or a silicon semiconductor thin-film transistor with a semiconductor layer including polysilicon. Depending on the type of transistor, the first electrode may be one of a source electrode and a drain electrode, and the second electrode may be the other of the source electrode and the drain electrode.

The first electrode of the driving transistor M1 may be connected to a driving voltage line VDL configured to supply the driving power supply voltage ELVDD, and the second electrode may be connected to the first electrode of the light-emitting diode LED. The gate electrode of the driving transistor M1 may be connected to a first node N1. The driving transistor M1 may control the amount of electric current flowing from the driving power supply voltage ELVDD through the light-emitting diode LED in response to a voltage of the first node N1.

The switching transistor M2 may be a switching transistor. The first electrode of the switching transistor M2 may be connected to the data line DL, and the second electrode of the switching transistor M2 may be connected to the first node N1. The gate electrode of the switching transistor M2 may be connected to a scan line SL. The switching transistor M2 may be turned on when the scan signal is supplied to the scan line SL, and may electrically connect the data line DL to the first node N1.

The sensing transistor M3 may be an initialization transistor and/or a sensing transistor. A first electrode of the sensing transistor M3 may be connected to a second node N2, and a second electrode of the sensing transistor M3 may be connected to a sensing line SEL. A gate electrode of the sensing transistor M3 may be connected to a control line CL.

The storage capacitor Cst may be connected between the first node N1 and the second node N2. For example, a first capacitor electrode of the storage capacitor Cst may be connected to the gate electrode of the driving transistor M1, and a second capacitor electrode of the storage capacitor Cst may be connected to the first electrode of the light-emitting diode LED.

Although FIG. 4 illustrates that each of the driving transistor M1, the switching transistor M2, and the sensing transistor M3 is an NMOS transistor, the disclosure is not limited thereto. For example, at least one of the driving transistor M1, the switching transistor M2, or the sensing transistor M3 may be a PMOS transistor.

Although three transistors are illustrated in FIG. 4, the disclosure is not limited thereto. The pixel circuit PC may include four or more transistors.

Figure 10:
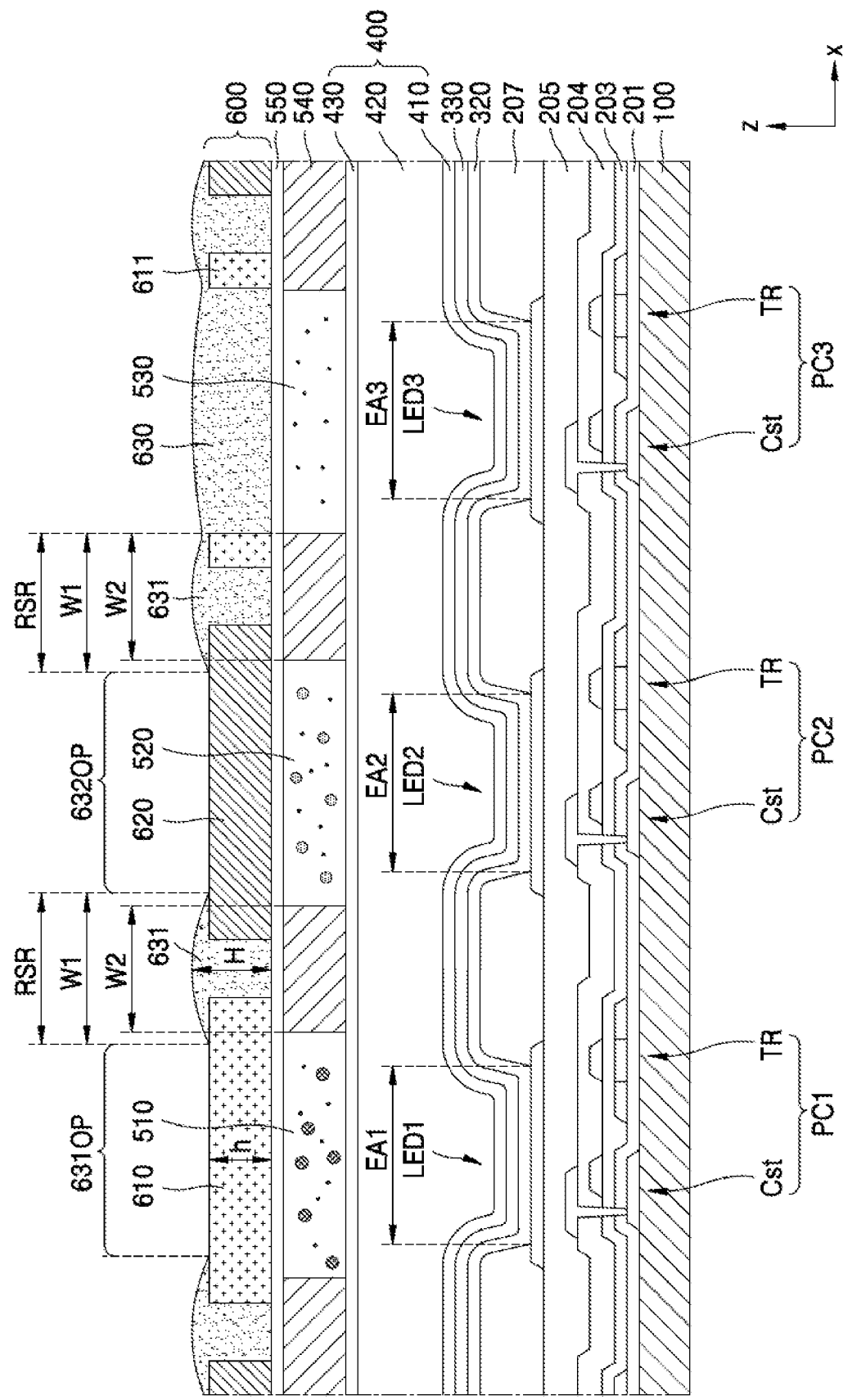
Figure 11:
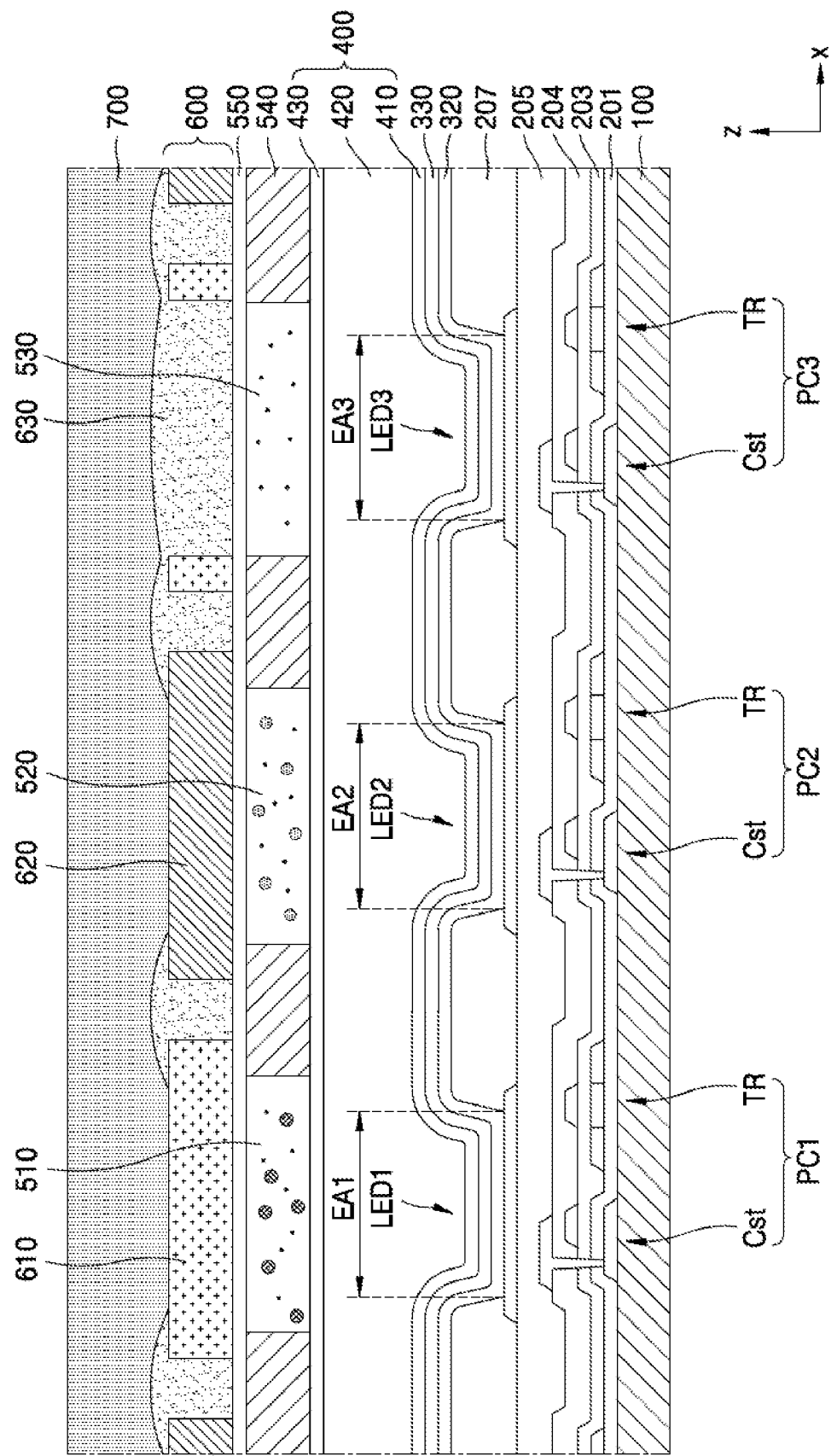
Figure 12A:
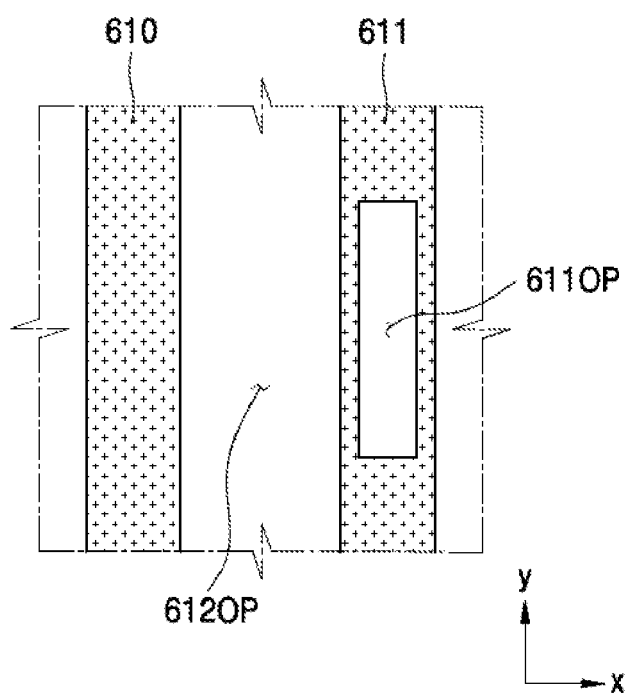
FIG. 12A is a plan view of a first color layer formed by a method of manufacturing a display device, according to some embodiments.
Figure 12B:
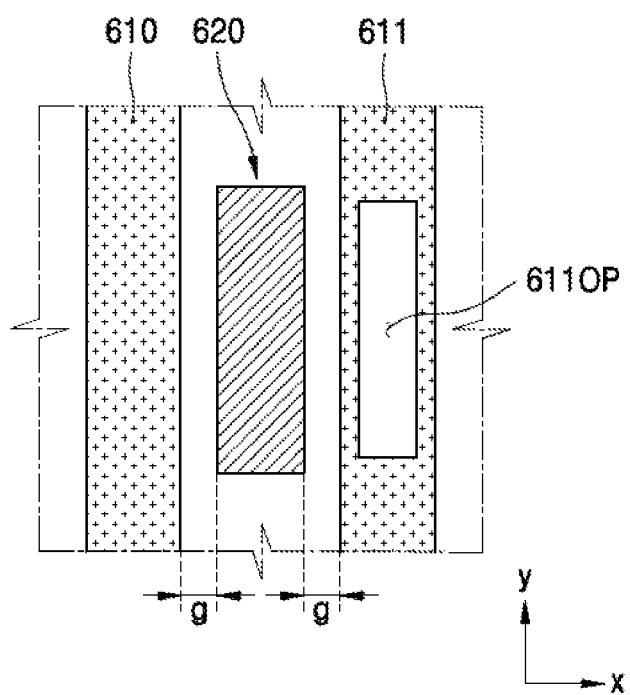
FIG. 12B is a plan view illustrating a state in which a second color layer is formed on the first color layer of FIG. 12A.
Figure 12C:
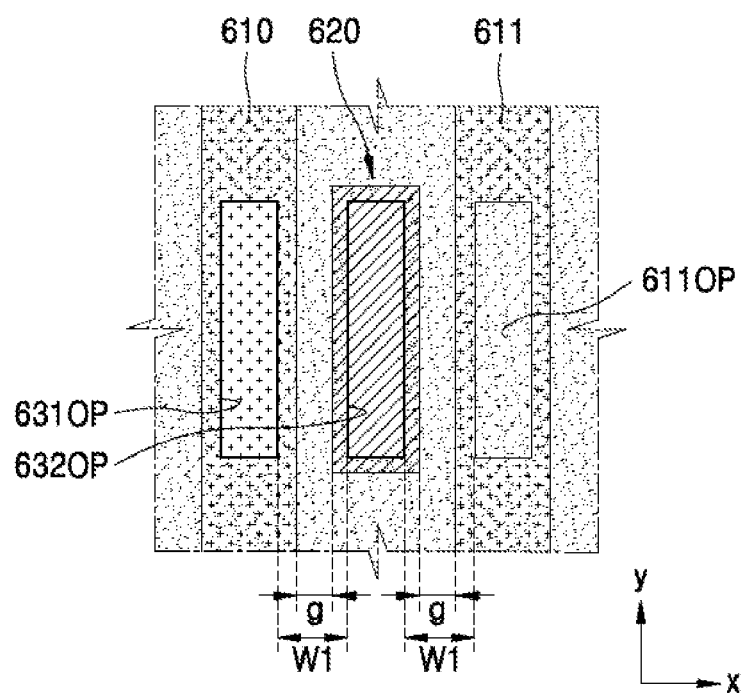
FIG. 12C is a plan view illustrating a state in which a third color layer is formed after the second color layer is formed.

FIGS. 5 to 11 are cross-sectional views for describing a method of manufacturing a display device, according to some embodiments, FIG. 12A is a plan view of a first color layer formed by a method of manufacturing a display device, according to some embodiments, FIG. 12B is a plan view illustrating a state in which a second color layer is formed on the first color layer of FIG. 12A, and FIG. 12C is a plan view illustrating a state in which a third color layer is formed after the second color layer is formed. Hereinafter, a case in which a light-emitting diode is an organic light-emitting diode will be described.

Figure 5:
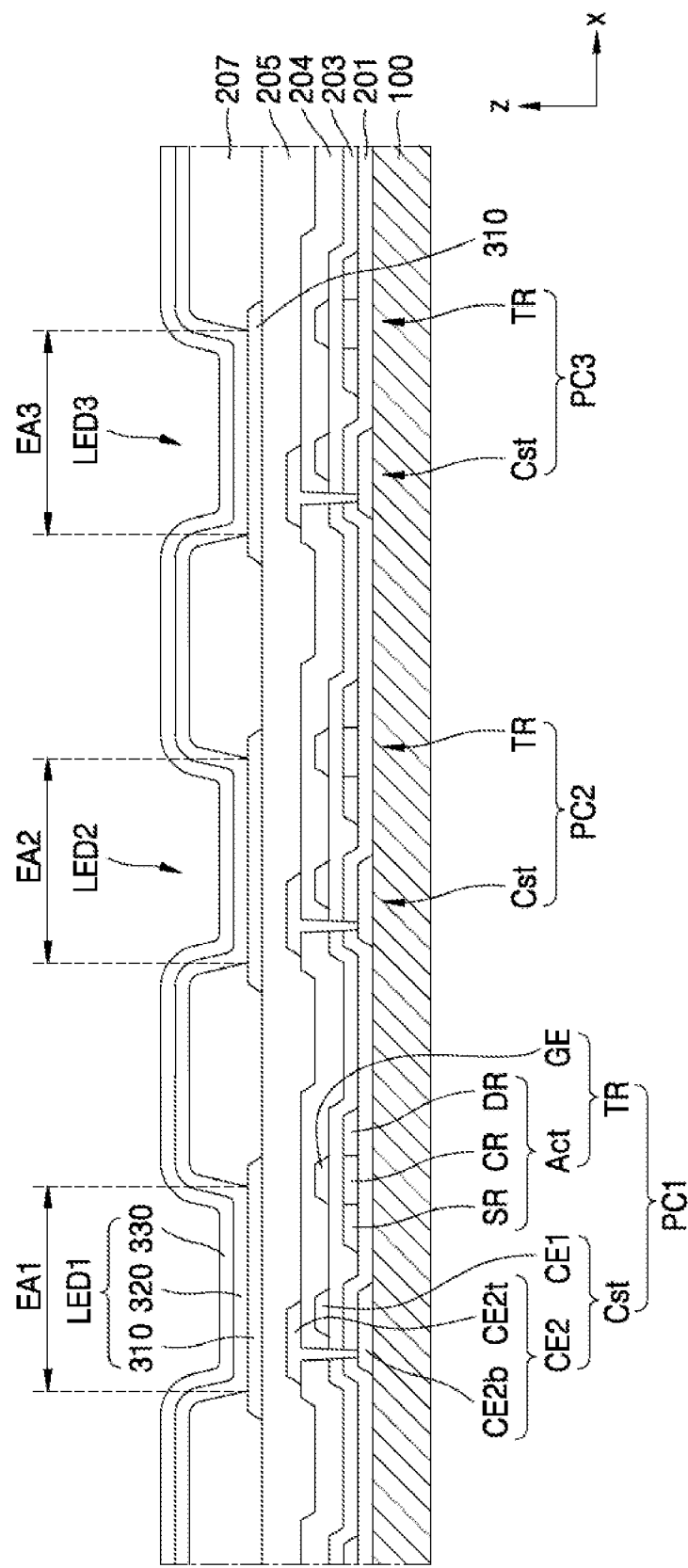
FIGS. 5 to 11 are cross-sectional views for describing a method of manufacturing a display device, according to some embodiments.

Referring to FIG. 5, first to third pixel circuits PC1, PC2, and PC3 are formed on a substrate 100. The substrate 100 may include glass or a polymer resin. The substrate 100 may be a glass substrate including SiO$_2$ as a main component. The glass substrate may be, for example, a glass substrate having a thickness of about 500 μm or an ultra-thin glass substrate having a thickness of about 30 μm. The substrate 100 including the polymer resin may be flexible, foldable, rollable, or bendable. In some embodiments, the substrate 100 may have a multilayer structure including an inorganic layer, and a layer including the above-described polymer resin.

Each of the first to third pixel circuits PC1, PC2, and PC3 includes a driving transistor, a switching transistor, a sensing transistor, and a storage capacitor, as described above with reference to FIG. 4. In this regard, FIG. 5 illustrates a storage capacitor Cst and a transistor TR corresponding to one of the driving transistor, the switching transistor, and the sensing transistor.

In some embodiments, the storage capacitor Cst may include a first capacitor electrode CE1 and a second capacitor electrode CE2. The second capacitor electrode CE2 may include a first sub-capacitor electrode CE2b and a second sub-capacitor electrode CE2t below and above the first capacitor electrode CE1, respectively, with the first capacitor electrode CE1 therebetween.

The first sub-capacitor electrode CE2b may be directly formed on the substrate 100. For example, the first sub-capacitor electrode CE2b may be in direct contact with the upper surface of the substrate 100. The first sub-capacitor electrode CE2b may include a conductive metal such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). In some embodiments, the driving voltage line, the common voltage line, and/or the data line described with reference to FIG. 4 may be formed together with the first sub-capacitor electrode CE2b in the same process.

After that, a buffer layer 201 may be formed. The buffer layer 201 may be on the first sub-capacitor electrode CE2b, and may include an inorganic insulating material. The buffer layer 201 may include an inorganic insulating material such as silicon nitride, silicon oxide, and/or silicon oxynitride, and may include a single-layer structure or a multilayer structure including the above-described inorganic insulating material.

Next, a semiconductor layer Act of the transistor TR may be formed. The semiconductor layer Act may include an oxide-based semiconductor material, such as IGZO or a silicon-based semiconductor material such as polysilicon.

A gate insulating layer 203 may be formed on the semiconductor layer Act. The gate insulating layer 203 may include an inorganic insulating material, such as silicon nitride, silicon oxide, and/or silicon oxynitride, and may include a single-layer structure or a multilayer structure including the above-described inorganic insulating material.

The gate electrode GE may be formed on the gate insulating layer 203, and may overlap a portion of the semiconductor layer Act. The gate electrode GE may overlap a channel region CR of the semiconductor layer Act. The semiconductor layer Act may include the channel region CR, and a source region SR and a drain region DR on respective sides of the channel region CR.

The first capacitor electrode CE1 may be formed on the same layer as the gate electrode GE, and may include the same material. The first capacitor electrode CE1 and the gate electrode GE may be formed in the same process. The first capacitor electrode CE1 and the gate electrode GE may include a conductive metal, such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). Alternatively, a transparent conductive oxide layer such as ITO on the above-described metal layer may be included.

An interlayer insulating layer 204 may be formed on the first capacitor electrode CE1 and the gate electrode GE. The interlayer insulating layer 204 may include an inorganic insulating material, such as silicon nitride, silicon oxide, and/or silicon oxynitride, and may include a single-layer structure or a multilayer structure including the above-described inorganic insulating material.

The second sub-capacitor electrode CE2t may be formed on the interlayer insulating layer 204. The second sub-capacitor electrode CE2t may be electrically connected to the first sub-capacitor electrode CE2b through a contact hole passing through an insulating layer(s) between the first sub-capacitor electrode CE2b and the second sub-capacitor electrode CE2t. For example, the second sub-capacitor electrode CE2t may be connected to the first sub-capacitor electrode CE2b through a contact hole passing through the buffer layer 201, the gate insulating layer 203, and the interlayer insulating layer 204.

A via insulating layer 205 may be formed on the first to third pixel circuits PC1, PC2, and PC3. The via insulating layer 205 may include an inorganic insulating material and/or an organic insulating material. For example, the via insulating layer 205 may include an organic insulating material such as acryl, benzocyclobutene (BCB), polyimide, or hexamethyldisiloxane (HMDSO).

Each of the first to third pixel circuits PC1, PC2, and PC3 on the substrate 100 may include a transistor TR and a storage capacitor Cst having the structure as described above, and may be electrically connected to the first electrode 310 of the corresponding light-emitting diode.

The first electrodes 310 may be spaced apart from each other on the via insulating layer 205. The first electrode 310 may include a reflective layer including silver (Ag), magnesium (Mg), aluminum (Al), platinum (Pt), palladium (Pd), gold (Au), nickel (Ni), neodymium (Nd), Iridium (Ir), chromium (Cr), or any compound thereof. The first electrode 310 may include a reflective layer including the above-described material, and a transparent conductive layer above and/or below the reflective layer. The transparent conductive layer may include indium tin oxide (ITO), indium zinc oxide (IZO), zinc oxide (ZnO), indium oxide (In$_2$O$_3$), indium gallium oxide (IGO), or aluminum zinc oxide (AZO). In some embodiments, the first electrode 310 may have a three-layer structure of an ITO layer/Ag layer/ITO layer.

A bank layer 207 may include an opening overlapping the first electrode 310 of each of the first to third light-emitting diodes LED1, LED2, and LED3. The bank layer 207 may expose the central portion of the first electrode 310 through the opening while covering the edge of the first electrode 310. The openings of the bank layer 207 may define emission areas EA1, EA2, and EA3 of the first to third light-emitting diodes LED1, LED2, and LED3, respectively.

The bank layer 207 may include an organic insulating material. For example, the bank layer 207 may include an organic insulating material such as acryl, benzocyclobutene (BCB), polyimide, or hexamethyldisiloxane (HMDSO).

An emission layer 320 may be formed on the bank layer 207, and a second electrode 330 may be formed on the emission layer 320. The emission layer 320 may include a high molecular weight organic material or a low molecular weight organic material that emits blue light, for example.

The emission layer 320 may be formed to cover the entire substrate 100. The second electrode 330 may be formed to cover the entire substrate 100.

The second electrode 330 may be a transflective or transmissive electrode. The second electrode 330 may be a transflective electrode including an ultra-thin metal including magnesium (Mg), silver (Ag), aluminum (Al), platinum (Pt), palladium (Pd), gold (Au), nickel (Ni), neodymium (Nd), iridium (Ir), chromium (Cr), or any compound thereof. The second electrode 330 may include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The first electrode 310, the emission layer 320, and the second electrode 330 overlapping each other through the opening of the bank layer 207 form the light-emitting diode that emits blue light. The light-emitting diodes are spaced apart from each other. In this regard, FIG. 5 illustrates first to third light-emitting diodes LED1, LED2, and LED3. The opening of the bank layer 207 may define an emission area of each of the light-emitting diodes. For example, the opening of the bank layer 207 corresponding to the first light-emitting diode LED1 may define a first emission area EA1, the opening of the bank layer 207 corresponding to the second light-emitting diode LED2 may define a second emission area EA2, and the opening of the bank layer 207 corresponding to the third light-emitting diode LED3 may define a third emission area EA3. The widths of the first to third light-emitting areas EA1, EA2, and EA3 correspond to the widths of the openings of the bank layer 207, respectively.

Figure 6:
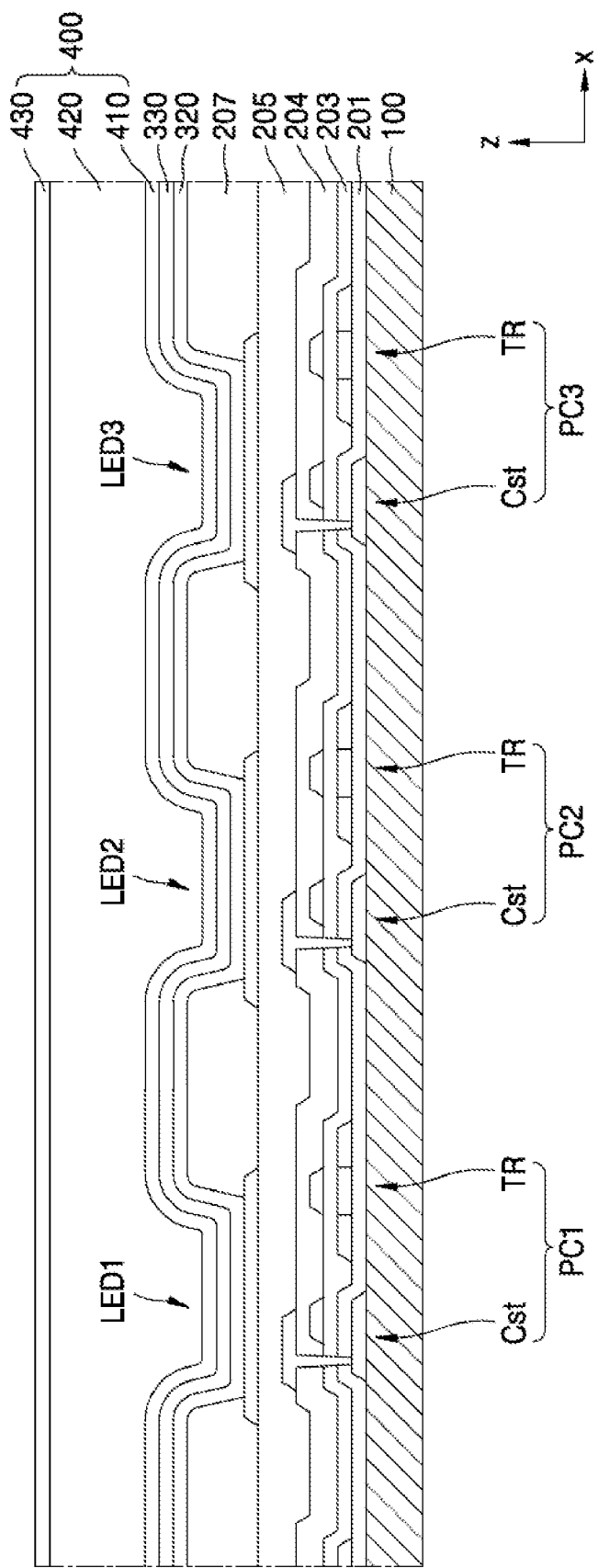

Referring to FIG. 6, an encapsulation layer 400 is formed on the first to third light-emitting diodes LED1, LED2, and LED3. The encapsulation layer 400 may include at least one inorganic encapsulation layer and at least one organic encapsulation layer. In some embodiments, the encapsulation layer 400 may include first and second inorganic encapsulation layers 410 and 430, and an organic encapsulation layer 420 therebetween.

Each of the first and second inorganic encapsulation layers 410 and 430 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The organic encapsulation layer 420 may include a polymer-based material. The polymer-based material may include an acrylic resin, an epoxy resin, polyimide, polyimide, and polyethylene. For example, the organic encapsulation layer 420 may include an acrylic resin such as polymethyl methacrylate or polyacrylic acid. The organic encapsulation layer 420 may be formed by curing a monomer or applying a polymer.

Figure 7:
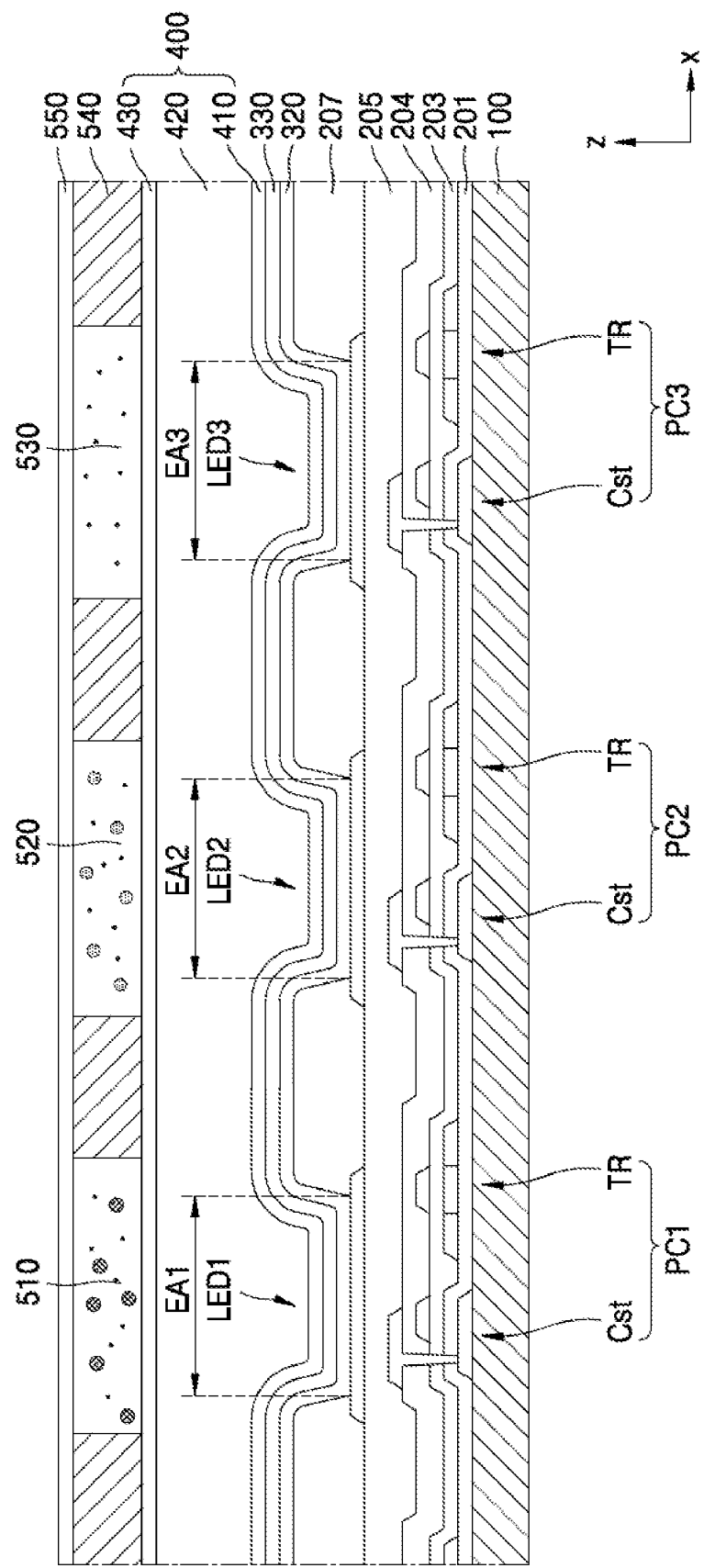

Referring to FIG. 7, a light blocking partition wall 540 may be formed on the encapsulation layer 400. The light blocking partition wall 540 may be formed to surround the emission area, for example, each of the first to third emission areas EA1, EA2, and EA3, and the light blocking partition wall 540 may have a mesh structure on a plane (x-y plane).

The light blocking partition wall 540 may include a colored insulating material, for example, a black insulating material. For example, the light blocking partition wall 540 may include a polyimide (PI)-based binder and a pigment in which red, green, and blue colors are mixed with each other. Alternatively, the light blocking partition wall 540 may include a cardo-based binder resin and a mixture of a lactam black pigment and a blue pigment. Alternatively, the light blocking partition wall 540 may include carbon black. The light blocking partition wall 540 may reduce or prevent the likelihood of light that is converted and scattered by the first and second color conversion parts 510 and 520 and the transmission part 530, which will be described later, traveling to other areas. Also, the light blocking partition wall 540 may reduce or prevent the reflection of external light together with color filters, which will be described later, and may improve the contrast of the display device.

After the light blocking partition wall 540 is formed, the first color conversion part 510, the second color conversion part 520, and the transmission part 530 are formed. Materials of the first color conversion part 510, the second color conversion part 520, and the transmission part 530 are the same as described above with reference to FIG. 3. The first color conversion part 510, the second color conversion part 520, and the transmission part 530 may be formed through an inkjet method.

An insulating layer 550 may completely cover the first color conversion part 510, the second color conversion part 520, the transmission part 530, and the light blocking partition wall 540. The insulating layer 550 is a type of barrier layer, and may protect elements therebelow, for example, the first color conversion part 510, the second color conversion part 520, the transmission part 530, and the light blocking partition wall 540 from external foreign impurities or matters. The insulating layer 550 may include an inorganic insulating material.

Figure 8:
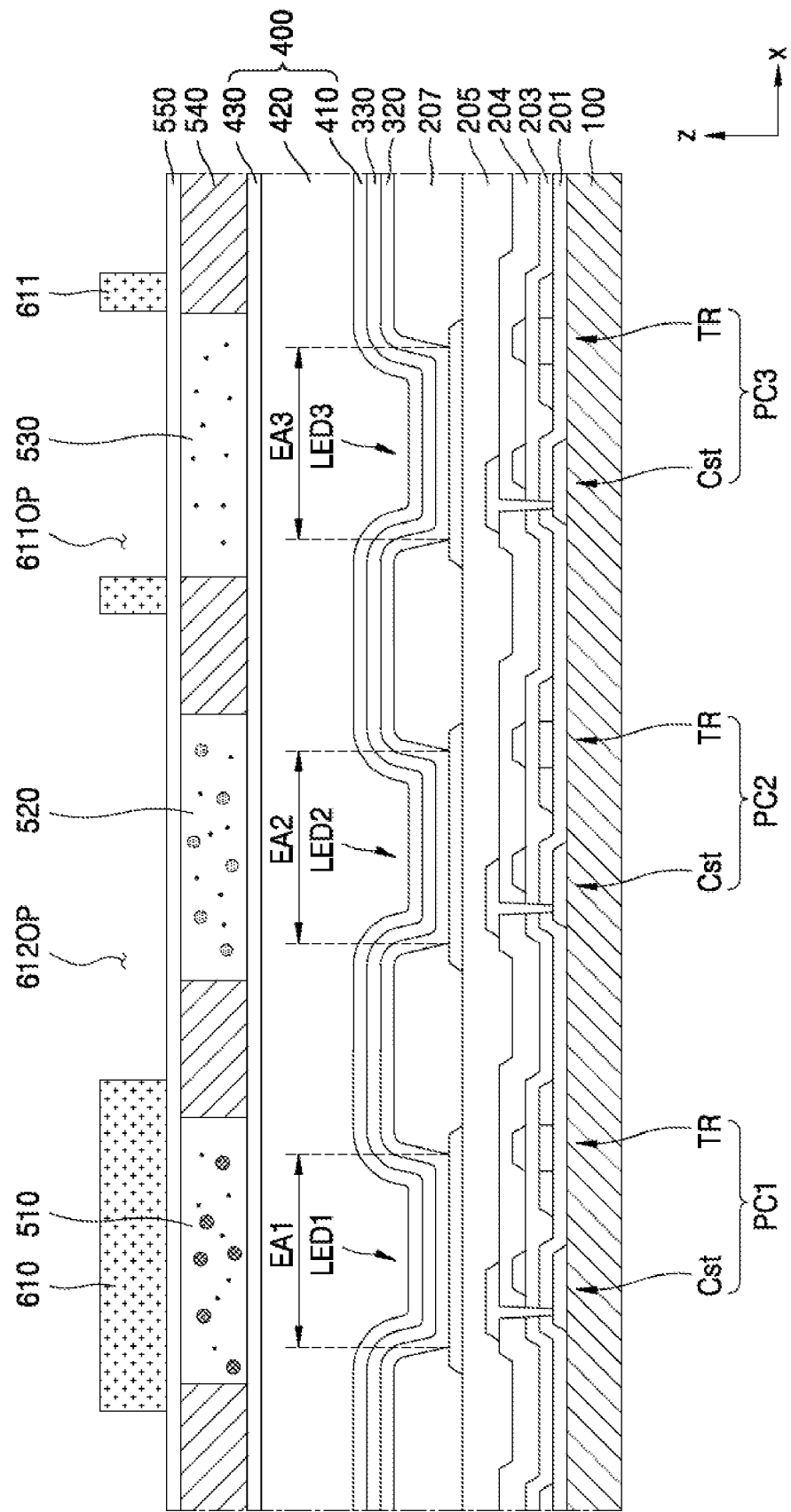

As illustrated in FIGS. 8 and 12A, a material layer having a first color may be formed and then patterned to form a first color layer including a first color filter 610 and a first dummy color filter 611.

The first color filter 610 may be positioned on the first emission area EA1 to overlap the first emission area EA1. The first color filter 610 may have a size that is greater than the first emission area EA1 so as to cover at least the first emission area EA1. For example, the inner portion (or the central portion) of the first color filter 610 may overlap and cover the first emission area EA1 and the first color conversion part 510 positioned directly below the first color filter 610, and the outer portion(s) (or the end portion(s)) of the first color filter 610 may overlap the light blocking partition wall 540 surrounding the first color conversion part 510.

During the process of forming the first color filter 610, the first dummy color filter 611 may be formed. The first dummy color filter 611 may have the same color as that of the first color filter 610, and may include the same material as that of the first color filter 610. The first color filter 610 and the first dummy color filter 611 may include a pigment or dye of a first color, for example, a red pigment or dye.

The first dummy color filter 611 may surround a first opening 6110P corresponding to the third emission area EA3. The first dummy color filter 611 may overlap the light blocking partition wall 540 surrounding the transmission part 530. As illustrated in FIG. 12A, in a plan view, the first opening 611OP may be completely surrounded by the first dummy color filter 611. A second opening 6120P may be between the first color filter 610, which corresponds to the first emission area EA1 in a plan view, and the first dummy color filter 611 surrounding the third emission area EA3 in a plan view. In other words, the first color layer is located at a position corresponding to the first emission area EA1, and is located in a non-emission area (or a light blocking area in which the light blocking partition wall 540 exists) between the neighboring emission areas, but does not exist at positions corresponding to the second and third emission areas EA2 and EA3.

Next, referring to FIG. 9, a material layer having a second color is formed on the structure described with reference to FIG. 8, and then is patterned to form a second color layer including a second color filter 620. In some embodiments, as illustrated in FIG. 12B, the second color layer may include the second color filter 620 having an isolated shape (or an island shape). The second color filter 620 may include a pigment or dye of a second color, for example, a green pigment or dye.

The second color filter 620 may be formed on the second emission area EA2 to overlap the second emission area EA2. The second color filter 620 may have a size that is greater than the second emission area EA2 so as to cover at least the second emission area EA2. The inner portion (or the central portion) of the second color filter 620 may overlap and cover the second emission area EA2 and the second color conversion part 520 positioned directly below the second color filter 620, and the outer portion(s) (or the end portion(s)) of the second color filter 620 may overlap the light blocking partition wall 540 surrounding the second color conversion part 520.

A first end portion of the second color filter 620 may be arranged adjacent to the first end portion of the first color filter 610, but does not necessarily come into contact with the first end portion of the first color filter 610. In other words, the first end portion of the first color filter 610 and the first end portion of the second color filter 620 may be adjacent to each other, but spaced apart from each other while maintaining a gap g.

Similarly, a second end portion of the second color filter 620 may be arranged adjacent to a first end portion of the first dummy color filter 611, but does not necessarily come into contact with the first end portion of the first dummy color filter 611. In other words, the second end portion of the second color filter 620 and the first end portion of the first dummy color filter 611 may be adjacent to each other, but spaced apart from each other while maintaining a gap g, noting that the distance between the second color filter 620 and the first dummy color filter may be different than the distance between the second color filter 620 and the first color filter 610 in some embodiments.

Figure 9:
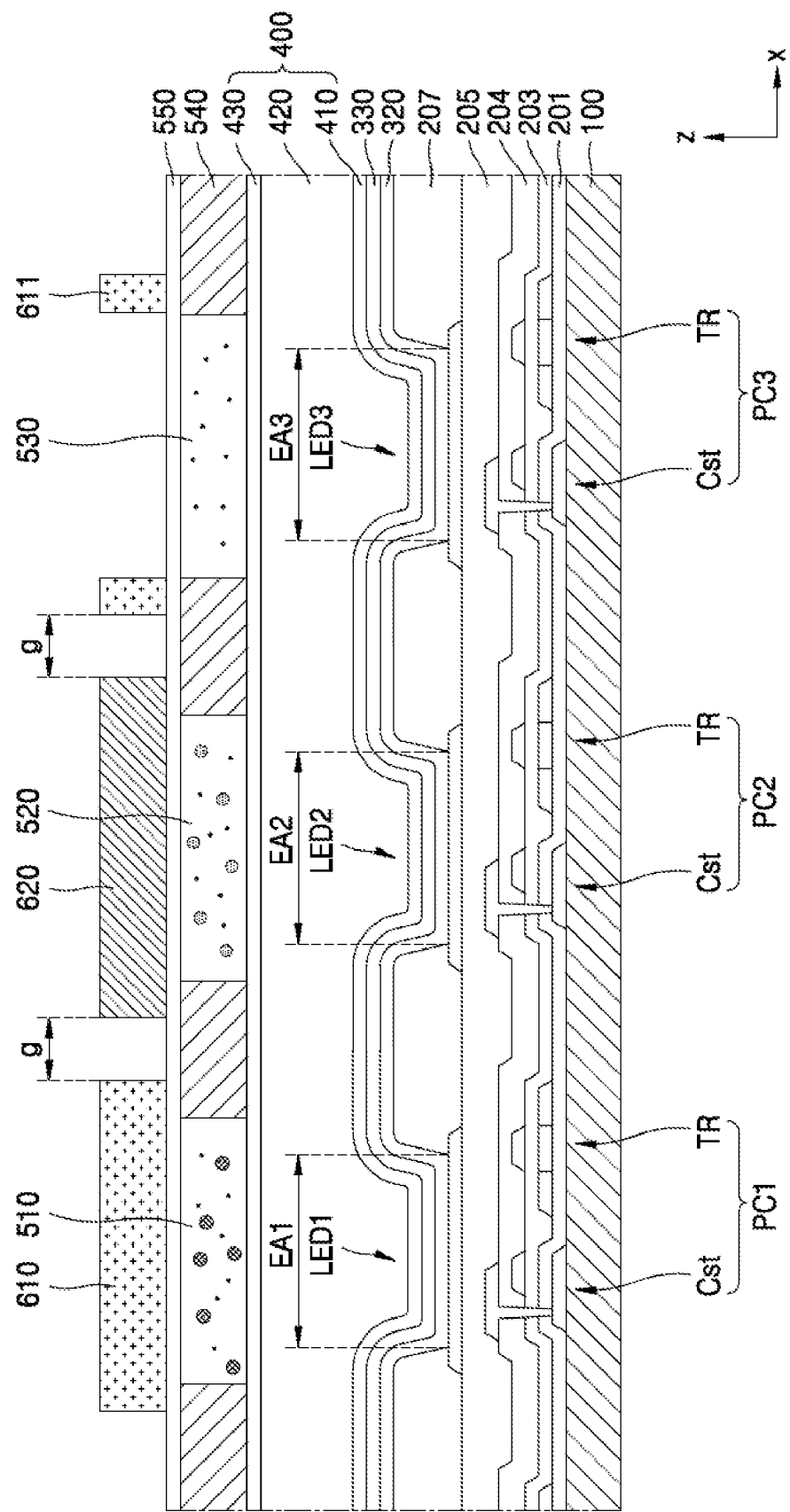

As illustrated in FIG. 10, a material layer having a third color is formed and then patterned to form a third color layer including a third color filter 630. The third color filter 630 may include a pigment or dye of a third color, for example, a blue pigment or dye. The overlapping structure of the first to third color layers described with reference to FIGS. 8 to 10 may form a color layer 600.

The third color filter 630 may be formed on the third emission area EA3 to overlap the third emission area EA3. The third color filter 630 may have a size that is greater than the third emission area EA3 so as to cover at least the third emission area EA3.

The third color filter 630 may extend to the non-emission area (or the light blocking area in which the light blocking partition wall 540 is positioned) between neighboring emission areas. In some embodiments, as illustrated in FIGS. 10 and 12C, the third color layer may define a third opening 631OP overlapping the first emission area EA1, and a fourth opening 6320P overlapping the second emission area EA2, and may include a third color filter 630 overlapping the third emission area EA3. A third color material 631 constituting the third color layer may be present in the non-emission area (or the area in which the light blocking partition wall 540 is positioned).

In the non-emission area (or the area in which the light blocking partition wall 540 is positioned) between the first emission area EA1 and the second emission area EA2, the first end portion of the first color filter 610 and the first end portion of the second color filter 620 may be spaced apart from each other to form a certain gap therebetween (see the gap "g" of FIG. 9), and may overlap the light blocking partition wall 540. In the non-emission area (or the area in which the light blocking partition wall 540 is positioned), the third color material 631 may overlap the first end portion of the first color filter 610 and the first end portion of the second color filter 620, which are spaced apart from each other, and a portion of the third color material 631 may at least partially fill the gap between the first color filter 610 and the second color filter 620. The third color material 631 may be in direct contact with the side surface of the first end portion of the first color filter 610 and the side surface of the first end of the second color filter 620, which face each other while maintaining the gap "g". The third color material 631 may be in direct contact with a portion of the upper surface of the first color filter 610 connected to the side surface of the first color filter 610, and with a portion of the upper surface of the second color filter 620 connected to the side surface of the second color filter 620, which have been described above.

The third color material 631 may have a substantially T-shaped cross-sectional structure with a convex upper surface. The lower surface of the third color material 631 may be in direct contact with the insulating layer 550 therebelow, like the lower surface of the first color filter 610 and the lower surface of the second color filter 620.

The structure of the first end portion of the first color filter 610 and the first end portion of the second color filter 620, which are spaced apart from each other, and of the third color material 631 overlapping the first end portions of the first and second color filters 610 and 620, corresponds to the structure of the light blocking area RSR of the color layer 600. A width of the light blocking area RSR of the color layer 600 corresponds to a width W1 of the third color material 631 described above.

The structure in the non-emission area (or the area in which the light blocking partition wall 540 is positioned) between the second emission area EA2 and the third emission area EA3 may be substantially the same as the structure in the non-emission area (or the area in which the light blocking partition wall 540 between the first color conversion part 510 and the second color conversion part 520 is positioned) between the first emission area EA1 and the second emission area EA2, as described above.

In the non-emission area (or the area in which the light blocking partition wall 540 is positioned) between the second emission area EA2 and the third emission area EA3, the second end portion of the second color filter 620 and the first end portion of the first dummy color filter 611 may be spaced apart from each other to form a certain gap therebetween (see the gap "g" of FIG. 9), and may overlap the light blocking partition wall 540. In the non-emission area (or the area in which the light blocking partition wall 540 is positioned), the third color material 631 may overlap the second end portion of the second color filter 620 and the first end portion of the first dummy color filter 611 that are spaced apart from each other. A portion of the third color material 631 may at least partially fill the gap "g". The third color material 631 may be in direct contact with the side surface of the second end portion of the second color filter 620 and the side surface of the first end of the first dummy color filter 611, which face each other while maintaining the gap "g". The third color material 631 may be in direct contact with a portion of the upper surface of the second color filter 620 connected to the side surface of the second color filter 620, and with at least a portion of the upper surface of the first dummy color filter 611 connected to the side surface of the first dummy color filter 611, which have been described above.

As described above, the third color material 631 may have a substantially T-shaped cross-sectional structure with a convex upper surface. Like the lower surface of the second color filter 620 and the lower surface of the first dummy color filter 611, the lower surface of the third color material 631 may be in direct contact with the insulating layer 550 therebelow.

A width W1 of the third color material 631 in the light blocking area RSR may be greater than a width W2 of the light blocking partition wall 540 therebelow. In other embodiments, the width W1 of the third color material 631 in the light blocking area RSR may be equal to the width W2 of the light blocking partition wall 540. Alternatively, in other embodiments, the width W1 of the third color material 631 in the light blocking area RSR may be less than the width W2 of the light blocking partition wall 540.

In the structure in the light blocking area RSR of the color layer 600, two color materials selected from three different color materials may be covered with the remaining one color material selected from the three different color materials while being spaced apart from each other with the gap therebetween (e.g., the gap "g" of FIG. 9). That is, the overlapping structure of different color materials in the light blocking area RSR is a structure in which a maximum of two color materials overlap each other. For example, in the corresponding light blocking area RSR between the first and second emission areas EA1 and EA2, the first color filter 610 of the first color and the second color filter 620 of the second color may be spaced apart from each other, but may be partly covered with the third color material 631 of the third color. Similarly, in the corresponding light blocking area RSR between the second and third emission areas EA2 and EA3, the first dummy color filter 611 of the first color and the second color filter 620 of the second color may be spaced apart from each other, but may be partly covered with the third color material 631 of the third color.

As a comparative example, in a case of a structure in which three different color material layers are stacked in the light blocking area RSR, the uppermost surface of the three color material layers overlapping each other in the light blocking area RSR has a curved surface having a curvature that is greater than that illustrated in FIG. 10. The curved surface of the color layer 600 in the light blocking area RSR may cause irregularities on the upper surface of the overcoat layer 700 (see FIG. 11) to be described later, and may cause diffuse reflection of external light incident on the display device.

However, according to some embodiments of the present disclosure, because the third color material is overlapped on the first and second color materials spaced apart from each other to have the gap therebetween (see gap "g" of FIG. 9), the diffuse reflection of external light described above may be reduced or minimized while maintaining the functions such as light blocking, color mixing, and absorption of external light.

The width W1 of the third color material 631 in the light blocking area RSR may be greater than the height H of the third color material 631. For example, the ratio of the height H to the width W1 (that is, H/W1) may be about 0.19 or less. In other words, the height H of the third color material 631 may be less than about 0.19 times the width W1 of the third color material 631. H represents the highest height of the third color filter 630 in the light blocking area. When the above-described condition is satisfied (that is, when H/W1<0.19 is satisfied), diffuse reflection may be reduced. As an experimental example, in the case of the display device having the structure according to the above embodiments, diffuse reflection could be reduced by about 48%, as compared with the display device according to the comparative example.

The height H of the third color material 631 may be greater than the height h of the central portion of the first color filter 610. As the difference between the height H of the third color material 631 and the height h of the center portion of the first color filter 610 increases, the diffuse reflection, which is caused by the curved surface of the color layer 600 in the light blocking area RSR, also increases. Therefore, it may be suitable that the difference between the height H of the third color material 631 and the height h of the central portion of the first color filter 610 is about 2.5 μm or less. In some embodiments, the height H of the third color material 631 may be about 6.5 μm, and the height h of the central portion of the first color filter 610 may be about 3.5 μm or greater.

The third color material 631 of the third color positioned on the uppermost layer in the light blocking area RSR may include a material having a relatively lower reflectance than color materials of other colors. For example, the reflectance of the third color material 631 may be less than the reflectance of the first and second color materials in a wavelength band of about 460 nm to about 55 nm. In this case, the third color layer including the third color material 631 is formed last, so that the uppermost layer of the color layer 600 in the light blocking area RSR has the third color, thereby reducing the reflection of external light.

According to the embodiments described with reference to FIGS. 8 to 10 and 12A to 12C, the first color layer including the first color filter 610 of the red color, the second color layer including the second color filter 620 of the green color, and the third color layer including the third color filter 630 of the blue color may be formed in the stated order (noting that the order of formation of the first color layer and the second color layer may be changed), but the disclosure is not limited thereto.

In other embodiments, when the second color material has a lower reflectance than the first and third color materials, the light blocking area RSR of the color layer 600 may include a structure in which the first color material and the second color material spaced apart from each other to have a gap therebetween are covered with the second color material. In such embodiments, after the first color layer including the first color material and the third color layer including the third color material are formed, the second color layer including the second color material may be formed.

The refractive index of the color material positioned on the uppermost layer in the light blocking area RSR may be less than the refractive index of other color materials. Referring to FIG. 10, the refractive index of the third color material 631 may be less than the refractive index of each of the first color filter 610, the first dummy color filter 611, and the second color filter 620. Therefore, the reflection of external light described above may be reduced more effectively. In some embodiments, the refractive index of the third color material 631 may be about 1.4 to about 1.8 (or about 1.5 to about 1.6).

Next, as illustrated in FIG. 11, an overcoat layer 700 is formed. The lower surface of the overcoat layer 700 facing the color layer 600 may include a concave and/or convex surface corresponding to the upper surface of the color layer 600. For example, the lower surface of the overcoat layer 700 may include a concave surface corresponding to the convex upper surface of the third color material 631.

The overcoat layer 700 may include a transmissive organic material such as an acrylic resin. The upper surface of the overcoat layer 700 including the organic material may include a relatively flat surface, and the flatness of the upper surface of the overcoat layer 700 may be greater than the flatness of the color layer 600.

The structure of the color layer 600 and the overcoat layer 700 described with reference to FIGS. 8 to 11 may be applied to a case in which the display device includes the color conversion-transmission layer, as illustrated in FIGS. 2 and 11, but the disclosure is not limited thereto. In other embodiments, the light-emitting diode layer of the display device may include red, green, and blue light-emitting diodes. In this case, the color conversion-transmission layer may be omitted. That is, when the light-emitting diodes emit light of different colors, the color conversion-transmission layer may be omitted. The above-described display device according to other embodiments may include the color layer 600 and the overcoat layer 700 having the structure described with reference to FIGS. 8 to 11 in order to reduce the reflection of external light.

According to embodiments, it is possible to reduce, prevent, or minimize the problem of reflection of external light due to irregularities on the upper surface of the color layer in the light blocking area. However, the scope of the disclosure is not limited by such an effect.

It should be understood that embodiments described herein should be considered in a descriptive sense only and not for purposes of limitation. Descriptions of features or aspects within any embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display device comprising:
 a substrate;
 a first light-emitting diode on the substrate in a first emission area;
 a second light-emitting diode on the substrate in a second emission area;
 an encapsulation layer on the first light-emitting diode and the second light-emitting diode, and comprising at least one inorganic encapsulation layer and at least one organic encapsulation layer;
 a color conversion-transmission layer on the encapsulation layer, and comprising a color conversion part configured to convert light emitted from one of the first light-emitting diode and the second light-emitting diode into light of a different color, and a light blocking partition wall surrounding the color conversion part;
 a first color filter on the color conversion-transmission layer, and corresponding to the first emission area; and
 a second color filter on the color conversion-transmission layer, and corresponding to the second emission area,
 wherein a first end portion of the first color filter and a first end portion of the second color filter are spaced apart from each other with a gap therebetween while overlapping the light blocking partition wall, and are at least partly covered with a third color material having a color that is different from the first color filter and the second color filter.

2. The display device of claim 1, wherein a portion of the third color material at least partially fills the gap.

3. The display device of claim 1, wherein the third color material is in direct contact with a side surface of the first end portion of the first color filter and with a side surface of the first end portion of the second color filter.

4. The display device of claim 1, further comprising an insulating layer on the color conversion-transmission layer,
 wherein a lower surface of the first color filter, a lower surface of the second color filter, and a lower surface of the third color material are in direct contact with the insulating layer.

5. The display device of claim 1, wherein a reflectance of the third color material is less than a reflectance of a first color material of the first color filter and is less than a reflectance of a second color material of the second color filter in a wavelength band of about 380 nm to about 780 nm.

6. The display device of claim 1, wherein a refractive index of the third color material is less than a refractive index of the first color filter and is less than a refractive index of the second color filter.

7. The display device of claim 1, wherein a height of the third color material is less than about 0.19 times a width of the third color material.

8. The display device of claim 1, wherein a height of the third color material is greater than a height of a central portion of the first color filter and is greater than a height of a central portion of the second color filter.

9. The display device of claim 1, further comprising an overcoat layer on the first color filter and the second color filter,
 wherein a lower surface of the overcoat layer comprises a concave surface corresponding to a convex upper surface of the third color material.

10. A display device comprising:
 a first light-emitting diode in a first emission area;
 a second light-emitting diode in a second emission area;
 an encapsulation layer on the first light-emitting diode and the second light-emitting diode, and comprising at least one inorganic encapsulation layer and at least one organic encapsulation layer;
 a first color filter on the encapsulation layer, corresponding to the first emission area, and having a first color; and
 a second color filter on the encapsulation layer, corresponding to the second emission area, and having a second color,
 wherein a first end portion of the first color filter and a first end portion of the second color filter are spaced apart from each other with a gap therebetween, and are at least partly covered with a third color material having a third color.

11. The display device of claim 10, wherein a portion of the third color material at least partially fills the gap.

12. The display device of claim 10, wherein the third color material is in direct contact with a side surface of the first end portion of the first color filter and with a side surface of the first end portion of the second color filter.

13. The display device of claim 10, further comprising an insulating layer below the first color filter and the second color filter,
wherein a lower surface of the first color filter, a lower surface of the second color filter, and a lower surface of the third color material are each in direct contact with the insulating layer.

14. The display device of claim 10, wherein a reflectance of the third color material is less than a reflectance of a first color material of the first color filter and is less than a reflectance of a second color material of the second color filter in a wavelength band of about 380 nm to about 780 nm.

15. The display device of claim 10, wherein a refractive index of the third color material is less than a refractive index of the first color filter and is less than a refractive index of the second color filter.

16. The display device of claim 10, wherein a height of the third color material is less than about 0.19 times a width of the third color material.

17. The display device of claim 10, wherein a height of the third color material is greater than a height of a central portion of the first color filter and is greater than a height of a central portion of the second color filter.

18. The display device of claim 1, further comprising a color conversion-transmission layer between the encapsulation layer and the first and second color filters, and comprising:
a first color conversion part configured to convert light emitted from one of the first light-emitting diode and the second light-emitting diode into light of a different color; and
a light blocking partition wall surrounding the first color conversion part.

19. The display device of claim 18, wherein the first end portion of the first color filter and the first end portion of the second color filter overlap the light blocking partition wall.

20. The display device of claim 18, wherein the gap between the first end portion of the first color filter and the first end portion of the second color filter overlaps the light blocking partition wall.

* * * * *